United States Patent
Liu et al.

(10) Patent No.: US 10,527,941 B2
(45) Date of Patent: Jan. 7, 2020

(54) EXTREME ULTRAVIOLET PHOTORESIST AND METHOD

(71) Applicant: Taiwan Semiconductor Manufacturing Co., Ltd., Hsinchu (TW)

(72) Inventors: Chen-Yu Liu, Kaohsiung (TW); Ya-Ching Chang, Hsinchu (TW); Cheng-Han Wu, Taichung (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 221 days.

(21) Appl. No.: 15/608,631

(22) Filed: May 30, 2017

(65) Prior Publication Data

US 2018/0348639 A1 Dec. 6, 2018

(51) Int. Cl.
*G03F 7/039* (2006.01)
*G03F 7/38* (2006.01)
*G03F 7/32* (2006.01)
*G03F 7/30* (2006.01)

(52) U.S. Cl.
CPC ............... *G03F 7/0392* (2013.01); *G03F 7/30* (2013.01); *G03F 7/325* (2013.01); *G03F 7/38* (2013.01)

(58) Field of Classification Search
CPC .......... G03F 7/2004; G03F 7/38; G03F 7/325; G03F 7/30; H01L 21/308; H01L 21/3085; H01L 21/3086; H01L 21/3088; H01L 21/0274; H01L 21/02252
See application file for complete search history.

(56) References Cited

U.S. PATENT DOCUMENTS

| | | | |
|---|---|---|---|
| 8,796,666 B1 | 8/2014 | Huang et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,921,480 B2 * | 3/2018 | Lai | G03F 7/2004 |
| 2002/0160315 A1 * | 10/2002 | Richter | G03F 7/0045 430/324 |
| 2017/0168398 A1 * | 6/2017 | Zi | G03F 7/16 |

* cited by examiner

*Primary Examiner* — Cynthia Hamilton
(74) *Attorney, Agent, or Firm* — Haynes and Boone, LLP

(57) ABSTRACT

The present disclosure provides a method for lithography patterning in accordance with some embodiments. The method includes forming a resist layer over a substrate and performing an exposing process to the resist layer. The resist layer includes a polymer backbone, an acid labile group (ALG) bonded to the polymer backbone, a sensitizer bonded to the polymer backbone, a photo-acid generator (PAG), and a thermo-base generator (TBG). The method further includes baking the resist layer at a first temperature and subsequently at a second temperature. The second temperature is higher than the first temperature. The method further includes developing the resist layer in a developer, thereby forming a patterned resist layer.

20 Claims, 8 Drawing Sheets

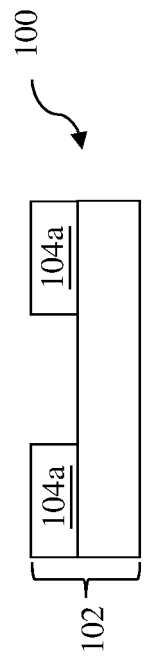
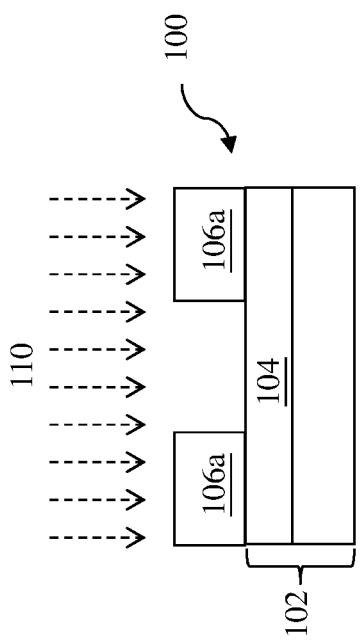
FIG. 1D
FIG. 1C

US 10,527,941 B2

EXTREME ULTRAVIOLET PHOTORESIST AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, extreme ultraviolet (EUV) lithography has been utilized to support critical dimension (CD) requirements of smaller devices. EUV lithography employs scanners using radiation in the EUV region, having a wavelength of about 1-100 nm. Some EUV scanners provide 4× reduction projection printing onto a resist film coated on a substrate, similar to some optical scanners, except that the EUV scanners use reflective rather than refractive optics. EUV lithography has imposed a complex set of requirements upon the resist film. Many variations of EUV photoresist have been explored, among which polyhydroxystyrene (PHS) resist exhibits very desirable properties for EUV lithography. However, there are various issues associated with developing the PHS resist in present negative tone developers, which cause resist film loss, increased line edge roughness (LER), increased line width roughness (LWR), and pattern deformation. It is desired to have a photoresist and a method using the photoresist that have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, and 1D illustrate cross sectional views of forming a semiconductor structure during a lithography patterning, in accordance with an embodiment.

DETAILED DESCRIPTION

Figure 1B:
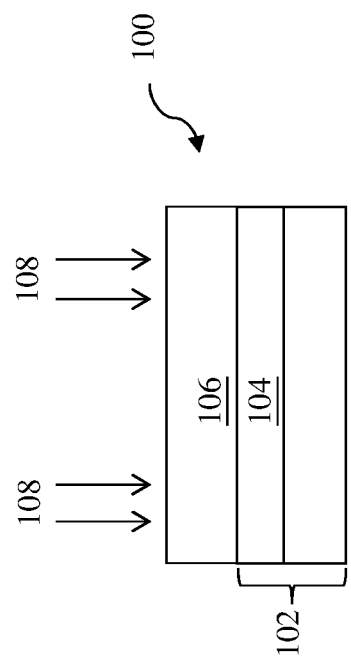

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to compositions of resist films in extreme ultraviolet (EUV) lithography and methods of using the same.

Generally, to produce the smallest possible circuitry, most advanced lithography systems are designed to use light of very short wavelength such as deep-ultraviolet light at a wavelength around 200 nm, or EUV at a wavelength of about 1-100 nm (e.g., 13.5 nm). Such light sources are relatively weak, so a resist film (or a resist layer) needs to be designed to utilize this light as efficiently as possible. One of the resist material used for EUV lithography is polyhydroxystyrene (PHS) resist. It has great potential for applications in EUV lithography due to its sensitivity to EUV wavelength and ability to stably generate secondary electrons.

After a resist layer is exposed to a radiation, it is developed in a developer (a chemical solution). The developer removes portions of the resist layer, thereby forming a resist pattern which may include line patterns and/or trench patterns. The resist pattern is then used as an etch mask in subsequent etching processes, transferring the pattern to underlying patterning layers. There are generally two types of processes for developing exposed resist films: a positive tone development (PTD) process and a negative tone development (NTD) process. The PTD process uses a positive tone developer. The NTD process uses a negative tone developer. The term "positive tone developer" as used herein indicates a developer that selectively dissolves and removes the exposed portions of a resist film not lower than a first predetermined threshold value. The term "negative tone developer" as used herein indicates a developer that selectively dissolves and removes the unexposed portions of a resist film as well as the under-exposed portions of the resist film, i.e., the areas exposed not higher than a second predetermined threshold value. The first and second threshold values may be the same or different, depending on the parameters of the resist material and the developer. In the following disclosure, the term "unexposed portion" of a resist film includes both unexposed and under-exposed portion of the resist film.

In present EUV lithography, NTD processes provide better optical performance for sub-10 nanometer (nm) fabrication than PTD processes with bright tone masks. However, the PHS resist has relatively high solubility in commonly used NTD developers, such as n-butyl acetate (n-BA), which dissolve a portion of the PHS resist even after the PHS resist is exposed with EUV radiations. This results in resist film loss. Specifically, a thickness of the remaining exposed portion of the resist layer becomes less than its original thickness after the NTD process, causing lower resist contrast between exposed portions and unexposed portions. Other resist pattern swelling problems may also occur, such as increased line edge roughness (LER), increased line width roughness (LWR), and even pattern deformation. An object of the present disclosure is to provide new and improved resist compositions that can achieve high pattern fidelity in advanced lithography processes including EUV lithography and e-beam lithography.

Referring now to FIGS. 1A-1D, shown therein is a series of cross-sectional views of a semiconductor device 100 undergoing lithography patterning. The semiconductor device 100 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device 100 includes a substrate 102. FIG. 1A illustrates the substrate 102, which is deposited with a resist layer 106 thereon. The substrate 102 includes one or more layers of material or composition. In an embodiment, the substrate 102 is a semiconductor substrate (e.g., wafer). In another embodiment, the substrate 102 includes silicon in a crystalline structure. In alternative embodiments, the substrate 102 includes other elementary semiconductors such as germanium, or a compound semiconductor such as silicon carbide, gallium arsenide, indium arsenide, and indium phosphide. The substrate 102 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment, the substrate 102 includes a patterning layer 104. In an embodiment, the patterning layer 104 is a hard mask layer including material(s) such as amorphous silicon (a-Si), silicon oxide, silicon nitride (SiN), titanium nitride, or other suitable material or composition. In an embodiment, the patterning layer 104 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the patterning layer 104 may include a high-k dielectric layer, a gate layer, a hard mask layer, an interfacial layer, a capping layer, a diffusion/barrier layer, a dielectric layer, a conductive layer, other suitable layers, and/or combinations thereof. In another embodiment, the substrate 102 is a mask substrate that may include a low thermal expansion material such as quartz, silicon, silicon carbide, or silicon oxide-titanium oxide compound. To further this example, the substrate 102 may be a mask substrate for making a deep ultraviolet (DUV) mask, an extreme ultraviolet (EUV) mask, or other types of masks.

The resist layer 106 is sensitive to radiation used in a lithography exposure process and has a resistance to etch (or implantation). The resist layer 106 may be formed by spin-on coating a polymeric material onto the substrate 102. In some examples, the resist layer 106 is further treated with a soft baking process before an exposure. In an embodiment, the resist layer 106 is a radiation sensitive layer, such as a photoresist including an I-line resist, a DUV resist including a krypton fluoride (KrF) resist and an argon fluoride (ArF) resist, a EUV resist, an electron beam (e-beam) resist, and an ion beam resist. In the present embodiment, the resist layer 106 is a resist sensitive to EUV radiation and is further for an NTD process, i.e., its solubility in a negative tone developer decreases upon EUV radiation. In an embodiment, the resist layer 106 contains PHS resist. For example, the resist layer 106 may contain more than 0% but less than 70% by weight PHS resist. To further this embodiment, the PHS resist may be a part of a copolymer in the resist layer 106, or may be blended with another polymer to form the resist layer 106. The resist layer 106 may also be referred to as the photoresist layer 106. The resist layer 106 further includes other chemicals, which will be described later.

Figure 1A:
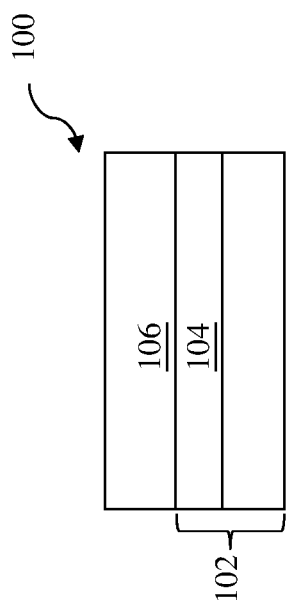

FIG. 1B illustrates an exposing process to expose the resist layer 106 to a radiation beam 108 in a lithography system. The radiation beam 108 may be an I-line (365 nm), a DUV radiation such as KrF excimer laser (248 nm) or ArF excimer laser (193 nm), a EUV radiation (e.g., 13.5 nm), an e-beam, an x-ray, an ion beam, or other suitable radiations. The exposing process may be performed in air, in a liquid (immersion lithography), or in a vacuum (e.g., for EUV lithography and e-beam lithography). In an embodiment, the radiation beam 108 is patterned with a mask, such as a transmissive mask or a reflective mask, which may include resolution enhancement techniques such as phase-shifting and/or optical proximity correction (OPC). In another embodiment, the radiation beam 108 is directly modulated with a predefined pattern, such as an IC layout, without using a mask (maskless lithography). In the present embodiment, the radiation beam 108 is a EUV radiation performed in a EUV lithography system.

Figure 2:
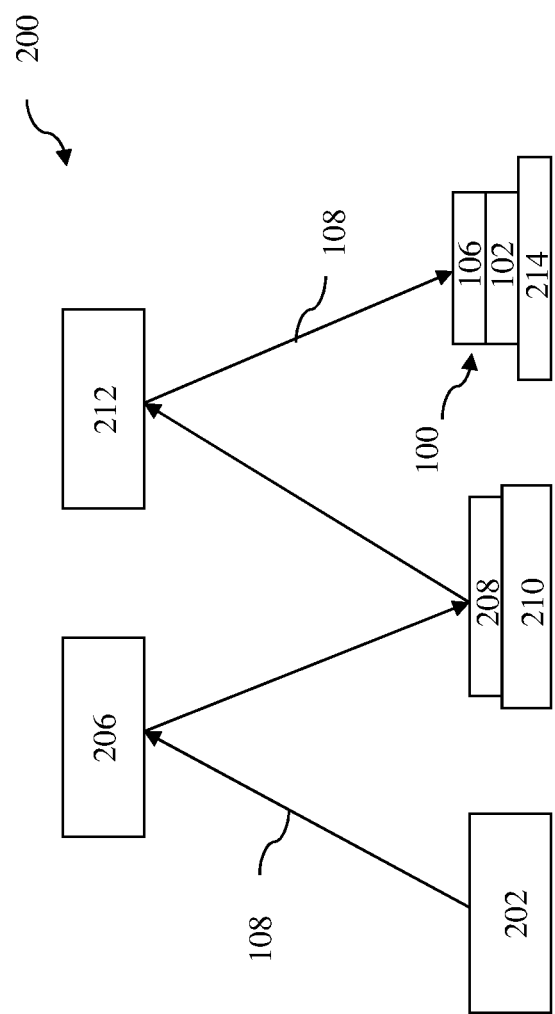
FIG. 2 illustrates an apparatus that may be employed for a lithography patterning, in accordance with some embodiments.

Referring to FIG. 2, the EUV lithography system 200 includes a radiation source 202 that produces the radiation beam 108, condenser optics 206, a mask stage 210 securing a mask 208 thereon, projection optics 212, and a substrate stage 214 securing the device 100 including the substrate 102 and the resist layer 106. Other configurations and inclusion or omission of items may be possible. In the present disclosure, the EUV lithography system 200 may be a stepper or a scanner.

The radiation source 202 provides the radiation beam 108 having a wavelength in the EUV range, such as about 1-100 nm. In an embodiment, the radiation beam 108 has a wavelength of about 13.5 nm. The condenser optics 206 includes a multilayer coated collector and a plurality of grazing mirrors. The condenser optics 206 is configured to collect and shape the radiation beam 108 and to provide a slit of the radiation beam 108 to the mask 208. The mask 208, also referred to as a photomask or a reticle, includes patterns of one or more target IC devices. The mask 208 provides a patterned aerial image to the radiation beam 108. The mask 208 is a reflective mask in the present embodiment, and may incorporate resolution enhancement techniques such as phase-shifting techniques and/or optical proximity correction (OPC). The mask stage 210 secures the mask 208 thereon, such as by vacuuming, and provides accurate position and movement of the mask 208 during alignment, focus, leveling and exposure operation in the EUV lithography system 200.

The projection optics 212 includes one or more lens and a plurality of mirrors. The lens may have a magnification of less than one thereby reducing the patterned aerial image of the mask 208 to the device 100, particularly, to the resist layer 106. The device 100 is secured by the substrate stage 214 which provides accurate position and movement of the device 100 during alignment, focus, leveling and exposing operation in the EUV lithography system 200 such that the patterned aerial image of the mask 208 is exposed onto the resist layer 106 in a repetitive fashion (though other lithography methods are possible). The exposed portions of the resist layer 106 become much less soluble in a negative tone developer than the unexposed portions. The semiconductor device 100 may be subjected to one or more post-exposure baking (PEB) processes, which accelerate the resist pattern formation process.

FIG. 1C shows developing the exposed resist layer 106 in a developer 110, constructed according to various aspects of the present disclosure. In the present embodiment, the developer 110 is a negative tone developer that dissolves and removes unexposed portions of the resist film 106, resulting in a resist pattern 106a. In the example as shown in FIG. 1C, the resist pattern 106a is represented by two line patterns. However, the following discussion is equally applicable to resist patterns represented by trenches.

As discussed above, a commonly used PHS resist may partially dissolve in a negative tone developer, resulting in resist film loss, reduced resist contrast, increased line edge roughness, and even pattern deformation. The Applicants have discovered new and improved photoresist compositions that provide superior performance in EUV lithography and methods of using the same. The resist layer 106 is an embodiment of the new and improved photoresist compositions.

Figure 3:
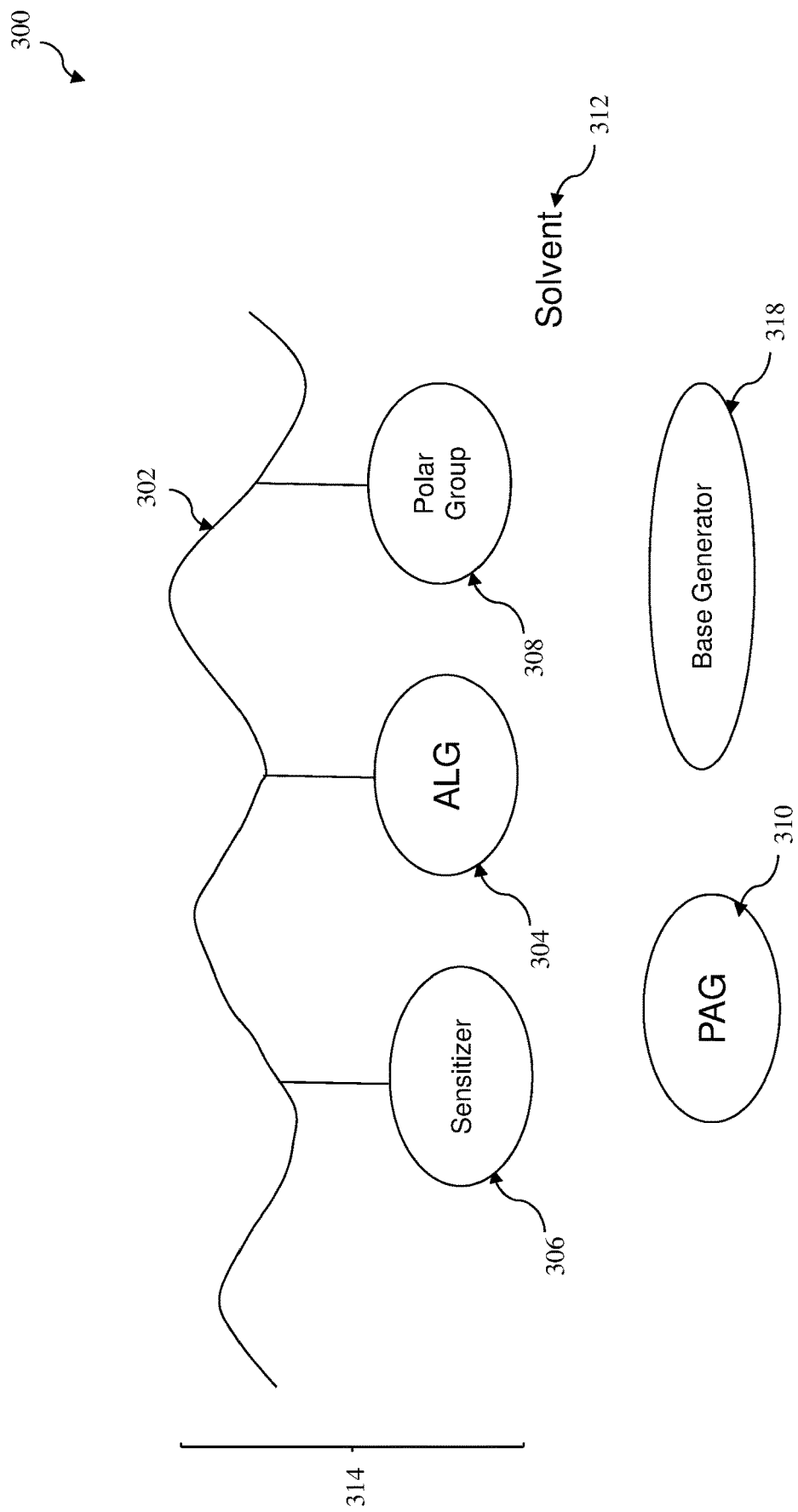
FIG. 3 illustrates a photoresist material that may be applied in FIG. 1A, in accordance with some embodiments.

FIG. 3 shows an embodiment of a resist material 300 used for the formation of the resist layer 106, constructed in accordance with various embodiments. The resist material 300 is sensitive to a first radiation, such as the EUV radiation (or EUV light). The first radiation has a first wavelength. The resist material 300 includes a polymer backbone 302, an acid labile group (ALG) 304 bonded to the polymer backbone 302, a sensitizer 306, a photo-acid generator (PAG) 310, and a base generator 318. The resist material 300 also includes solvent 312. The sensitizer 306 could be blended in the solvent 312 or bonded to the polymer backbone 302. The resist material 300 may further include a polar group 308 that is bonded to the polymer backbone 302. In some embodiments, the resist material 300 may include other additives, such as quencher. In the present embodiment, the polymer backbone 302, the ALG 304, the sensitizer 306, and the polar group 308 are chemically bonded to form a polymer 314. The PAG 310 and the base generator 318 are blended with the polymer 314 in the solvent 312.

Figure 4:
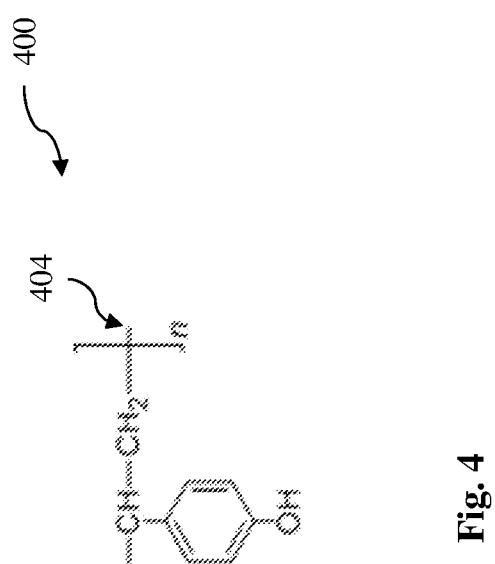
FIG. 4 is a diagram showing an illustrative polymer structure that may be used in a photoresist, in accordance with some embodiments.

The polymer backbone 302 provides resistance to etch (or implantation). In various embodiments, the polymer backbone 302 includes an acrylate-based polymer, a poly(norbornene)-co-malaic anhydride (COMA) polymer, or a polyhydroxystyrene (PHS) polymer. For example, the acrylate-based polymer includes a poly (methyl methacrylate) (PMMA) polymer. The PHS polymer includes a plurality of PHS polymer structure 400 shown in FIG. 4, in which n is an integer greater than 2. The PHS polymer structure 400 includes two ends 402 and 404 that are chemically linkable with each other. Furthermore, PHS polymer is also sensitive to the EUV radiation and is able to function as sensitizer in a EUV photoresist. Accordingly, a plurality of the polymer structures 400 are chemically bonded together (through the two ends 402 and 404), forming a PHS polymer backbone.

Referring back to FIG. 3, the resist material 300 includes a sensitizer 306 to increase the sensitivity and efficiency of the resist material. The PAG 310 in the resist material may not be sensitive to the EUV radiation but is more sensitive to electrons or other radiation, such as UV or DUV radiations. Thus, by incorporating the sensitizer 306, the resist material 300 has an enhanced sensitivity to the first radiation. Particularly, the sensitizer 306 is sensitive to the first radiation and be able to generate a second radiation in response to the first radiation. In some embodiments, the sensitizer 306 absorbs the first radiation with a first wavelength and generates a second radiation with a second wavelength. The second wavelength is greater than the first wavelength. In furtherance of the embodiment, the first radiation is the EUV radiation and the first wavelength is about 13.5 nm; and the second wavelength ranges between 180 nm and 250 nm. In some embodiments, the first radiation is the EUV radiation and the second radiation is electron(s). The sensitizer 306 absorbs the EUV radiation and generates secondary electron(s). Furthermore, the PAG 310 is sensitive to the secondary electron, absorbing the secondary electron and generating acid. In various examples, the sensitizer 306 includes a fluorine-containing chemical, a metal-containing chemical, a phenol-containing chemical or a combination thereof. In some examples, the sensitizer 306 includes a polyhydroxystyrene chemical structure. In other examples, the sensitizer 306 includes polyfluorostyrene or polychlorostyrene. The sensitizer 306 is bonded to the polymer backbone 302. Alternatively or additionally, the sensitizer 306 is mixed with the polymer 314 and the PAG 310 in the solvent 312. For example, some of the sensitizer is mixed with the polymer 314 and some of the sensitizer is chemically bonded to the polymer 314.

The resist material 300 further includes an acid generating compound (AGC) 310, such as photoacid generator (PAG), also referred to as the PAG 310. The PAG 310 and the polymer 314 are mixed in the solvent 312 before the resist material 300 is applied to a workpiece, such as a semiconductor wafer, during a lithography process. The PAG 310 absorbs radiation energy and generates acid. In various examples, the PAG 310 is sensitive to the first radiation, the second radiation or both. Usually the PAG 310 is not sensitive enough to the first radiation. Thus, by incorporating the sensitizer 306, the resist material 300 has an enhanced sensitivity to the first radiation. For example, the first sensitizer 306 generates the second radiation in response to the first radiation and the PAG 310 generates acid in response to the second radiation. In some examples for illustration, the PAG 310 may include perfluorosulfonate, diphenyliodonium trifluoromethane sulfonate, diphenyliodonium nonafluorobutane sulfonate, triphenylsulfonium trifluromethane sulfonate, triphenylsulfonium nonafluorobutane sulfonate, ethanone, ethanone, triphenylsulfonium bis(perfluoromethanesulfonyl) imide, triazine, or combinations thereof. In some examples, the sensitizer 306 releases secondary electron(s) in response to the first radiation and the PAG 310 is designed to have specific chemical structures to better absorb the secondary electron. Specifically, the PAG 310 may include at least one heterocyclic ring having at least one nitrogen or oxygen atom in addition to several carbon atoms. The PAG 310 may also have at least one double bond within that heterocyclic ring.

Figure 5A:
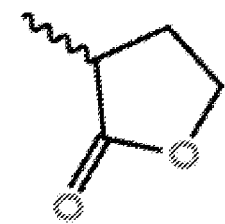
FIGS. 5A and 5B show illustrative chemical structures of a polar group for a photoresist material of FIG. 3, in accordance with some embodiments.
Figure 5B:
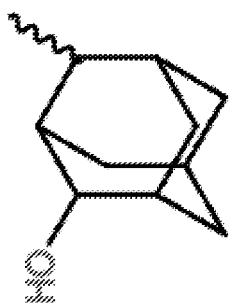

In some embodiments, the resist material 300 also includes a polar group 308 bonded to the polymer backbone 302. A "polar group" as described herein is a group having an electric dipole or multipole moment. Polar molecules are those that may interact through dipole-dipole intermolecular forces or hydrogen bonds. The polar group may include one or more polarity force functional groups including, but not limited to, hydroxyl, various amino or amines, sulfhydryl, ester, amide, carboxylic acid group, imide functional group, carbamate functional group, aldehyde functional group, or keytone functional group. In one embodiment, the polar group 308 is a lactone. During developing, the polar group 308 exhibits high solubility in an aqueous solvent and low solubility in an organic solvent due to its polarity. Therefore, the loading of the polar group 308 on the polymer backbone 302 can be adjusted to tune the dissolution rate of the resist material 300 in a developer. Various examples of the polar group chemical structures are shown in FIGS. 5A and 5B.

Referring back to FIG. 3, the resist material 300 further includes an ALG 304. The ALG 304 is chemically bonded to the polymer backbone 302. The ALG 304 functions as a dissolution inhibitor that responds to acid. The ALG 304 is a chemical group that would be deprotected by PAG 310 in exposed portions of the resist layer. Thus, the exposed resist material 300 will change the polarity and solubility. For example, under the EUV radiation, acid is released from the PAG 310 in response to the second radiation or electrons generated by the sensitizer 306, and then some ALG 304 in the exposed resist material 300 are cleaved due to chemical reactions with the acid. A post-exposure baking (PEB) process may be applied to facilitate such chemical reactions. As a result, the exposed portions of the resist layer 106 are changed chemically (such as more hydrophilic or more hydrophobic). When the exposing dose of the lithography exposing process reaches a dose threshold, the exposed resist layer 106 will be insoluble in the developer or alternatively the exposed resist layer 106 will be soluble in the developer. In some examples, the resist layer 106 experiences a polarity change after the exposing process, and a dual-tone developing process may be implemented. In some examples, if the resist layer 106 is changed from a nonpolar state (hydrophobic state) to a polar state (hydrophilic state), then the exposed portions will be removed by an aqueous solvent, such as tetramethyl ammonium hydroxide (TMAH), or alternatively the unexposed portions will be removed by an organic solvent, such as butyl acetate. In some other examples, the resist layer 106 is changed from a polar state to a nonpolar state, then the exposed portions will be removed by an organic solvent or the unexposed portions will be removed by an aqueous solvent.

The loading ratio on the polymer backbone 302 between the sensitizer 306, the polar group 308, and the ALG 304 may be determined by the desired characteristics of the resist layer 106, such as the polarity, solubility, the molecular weights, the molecular weight dispersity, etching selectivity, etc. In some embodiments, among the sensitizer 306, the polar group 308, and the ALG 304, the relative molar concentration is 10% to 70% for the sensitizer 306, 5% to 50% for the polar group 308, and 20% to 80% for the ALG 304. In a specific embodiment, the relative molar concentration is about 30% for the sensitizer 306, about 10% for the polar group 308, and about 60% for the ALG 304.

Figure 6:
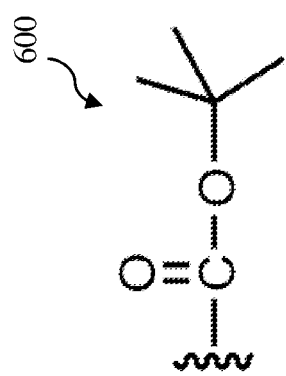
FIG. 6 is a diagram showing an illustrative chemical structure that may be used in an acid labile group (ALG) for a photoresist material of FIG. 3, in accordance with some embodiments.
Figure 7B:
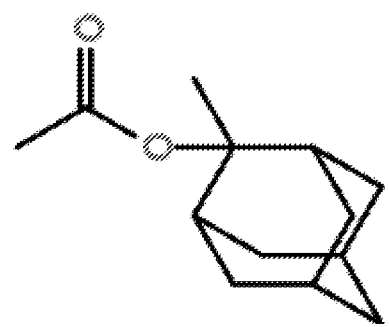
FIGS. 7A and 7B show various chemical structures of an ALG for a photoresist material of FIG. 3, which would contain a carboxyl group after a cleavage, in accordance with some embodiments.
Figure 7A:
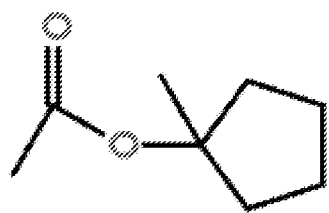

In some embodiments, the ALG 304 includes a t-butoxycardbonyl (tBOC) 600, as illustrated in FIG. 6. In the present embodiment, after the ALG 304 is cleaved during chemical reactions with the acid released from the PAG 310, the cleaved ALG 304 includes a carboxyl group bonded to the polymer backbone 302, such as —COOH. Various examples of the ALG 304 chemical structures that would contain —COOH after the cleavage are illustrated in FIGS. 7A and 7B.

The carboxyl group has certain solubility in commonly used negative tone developers, such as an n-butyl acetate (n-BA) solvent, which causes resist film loss during developing. When a carboxyl group is ionized, it loses a proton from its —OH and becomes a carboxylate anion group. For example, a —COOH becomes —COO$^-$ after an ionization. A carboxylate anion group has stronger polarity than a carboxyl group, which reduces the solubility of the ALG 304 in an organic solvent. As a result, after an exposure, a resist layer with —COO$^-$ bonded with the polymer backbone will suffer less resist film loss during an NTD process. According to principles described in the present disclosure, the base generator 318 is mixed in the resist material 300 to lease base(s) to cause chemical reactions with the carboxyl group in the cleaved ALG 304 after the exposing process to create the carboxylate anion group, thereby reducing the resist film loss during an NTD process.

Referring back to FIG. 3, the resist material 300 further includes the base generator 318. The base generator 318 and the polymer 314 are mixed in the solvent 312. In various embodiments, the base generator 318 is a thermo-base generator (TBG). After the EUV radiation, a PEB process with two baking steps is applied. During the first baking step, the resist layer 106 is heated to a first temperature below the triggering temperature for the TBG to decompose and release a base. In some embodiments, the first temperature is within a range of 90 degree Celsius to 150 degree Celsius. This first baking step can be regarded as a regular post-exposure baking. This step promotes the thermally activated diffusion of acid formed during exposure from the PAG 310. The diffusion smoothens the spatial periodic pattern of acid having their origin in standing light waves during exposure especially in case of highly reflective substrates. If the resist material 300 is a chemically amplified resist (CAR) that employs chemical amplifier reactions, the first baking step also catalytically performs and completes the photo reaction initiated during the exposure, allowing the acid to proceed multiple times chemical amplifier reactions and sufficiently deprotect acid labile groups. The second baking step is after the first baking step, which heats the resist layer 106 to a second temperature. The second temperature is higher than the first temperature and above the triggering temperature for the TBG to decompose and release a base. In some embodiments, the second temperature is within a range of 130 degree Celsius to 250 degree Celsius. The TBG decomposes and releases a base under the second temperature. The base will have a chemical reaction with the carboxyl group in the cleaved ALG to dissociate a proton from an —OH in the carboxyl group, leaving the shared electrons with the oxygen. Thus the carboxyl group has an excess of electrons over protons and becomes a carboxylate anion group. The polarity of the resist layer 106 is thus further adjusted and its solubility in the negative tone developer is reduced more after this chemical reaction with the base.

The TBG may include a chemical group selected from an amide, a sulfonamide, an imide, an imine, an O-acyl oxime, and a benzoyloxycarbonyl derivative. In some embodiments, the weight percentage of TBG in the resist material 300 is 30% or less. In an embodiment, the PEB process employs a first temperature within a range of 90 degree Celsius to 130 degree Celsius for duration of 30 seconds to 300 seconds (e.g., 60 seconds) and a second temperature within a range of 140 degree Celsius to 250 degree Celsius for duration of 30 seconds to 300 seconds (e.g., 60 seconds). Both baking steps are performed prior to the developing of the resist layer 106.

In some alternative embodiments, the base generator 318 is a photobase generator (PBG). When absorbing radiation energy at certain wavelength, the PBG decomposes and releases a base. The PBG is insensitive to the first radiation used in the exposing process (e.g., the EUV radiation) and insensitive to the second radiation or electrons emitted by the sensitizer 306. Therefore, during the exposing process, the PBG does not decompose. After the exposing process, a PEB process is applied to the resist layer 106. In a specific embodiment, the PEB process is performed in a thermal chamber at temperature ranging between 120 degree Celsius and 160 degree Celsius. The PEB process promotes the thermally activated diffusion. The PEB process may also catalytically perform the photo reaction initiated during the exposure that sufficiently decomposes the PAG 310 and cleaves the ALG 304 in the resist layer 106. After the PEB process, a second exposing process is applied to the whole resist layer 106 prior to the developing process. In some embodiments, the wavelength of the radiation used in this second exposing process is different from the wavelengths of the first radiation and the second radiation emitted by the sensitizer 306, and the PBG is sensitive to this wavelength in the second exposing process. In some other embodiments, the wavelength of the radiation used in this second exposing process is close to or the same as the wavelength of the second radiation emitted by the sensitizer 306, but at a higher exposing dose that is strong enough to decompose the PBG. The second exposing process may be a blanket exposing to the whole resist layer 106 without using a mask or alternatively an exposing to the same exposed portions in the previous exposing process with a mask. In the portions of the resist layer 106 receiving the radiation, the PBG decomposes and releases a base. In the unexposed portions in the previous exposing, the base would not substantially affect the solubility of the resist layer 106. As a comparison, in the exposed portions in the previous exposing process, the base will have a chemical reaction with the carboxyl group in the cleaved ALG to create the carboxylate anion group. The carboxylate anion group is bonded to the polymer backbone 302 and reduces solubility of the resist material in the negative tone developer. Examples of the PBG include one of a carbamate, a carbamonylhydroxy amine, oxime, sulfonamide, lactam (or cyclic amide), other suitable materials, and/or combinations thereof. In some embodiments, the PAG 310 is insensitive to the radiation used in this second exposing process and does not release an acid to neutralize the base released from the base generator 318.

Back to FIG. 1C, the developer 110 is applied to the resist layer 106 constructed according to various aspects of the present disclosure. The developer 110 may include an organic solvent. In some embodiments, the polymers in the organic solvent have a carbon number less than 15. In some embodiments, the developer 110 may contain an ester group or a ketone group. In some embodiments, the developer 110 may contain 2-heptanone, n-butyl acetate, isoamyl acetate, cyclohexanone, 2-heptanone, 5-methyl-2-hexanone, methyl-2-hydroxyisobutyrate, ethyl lactate, propylene glycol, monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, and isobutyl propionate. The unexposed portions (including under-exposed portions) of the resist layer 106 are dissolved by the developer 110, leaving the exposed portion 106a as the resist pattern over the substrate 102. Due to the properties of the resist material 300 discussed above, the resist pattern 106a has improved smooth edges and sidewalls, therefore relatively high resist contrast and relatively low LER and LWR.

FIG. 1D illustrates an etching process that etches the substrate 102 using the resist pattern 106a as an etch mask, thereby transferring the pattern from the resist pattern 106a to the substrate 102. In an embodiment, the patterning layer 104 is a hard mask layer. To further this embodiment, the pattern is first transferred from the resist pattern 106a to the hard mask layer 104, then to other layers of the substrate 102. For example, the hard mask layer 104 may be etched through openings of the resist pattern 106a using a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The resist pattern 106a may be partially or completely consumed during the etching of the hard mask layer 104. In an embodiment, any remaining portion of the resist pattern 106a may be stripped off, leaving a patterned hard mask layer 104a over the substrate 102, as illustrated in FIG. 1D.

Figure 8:
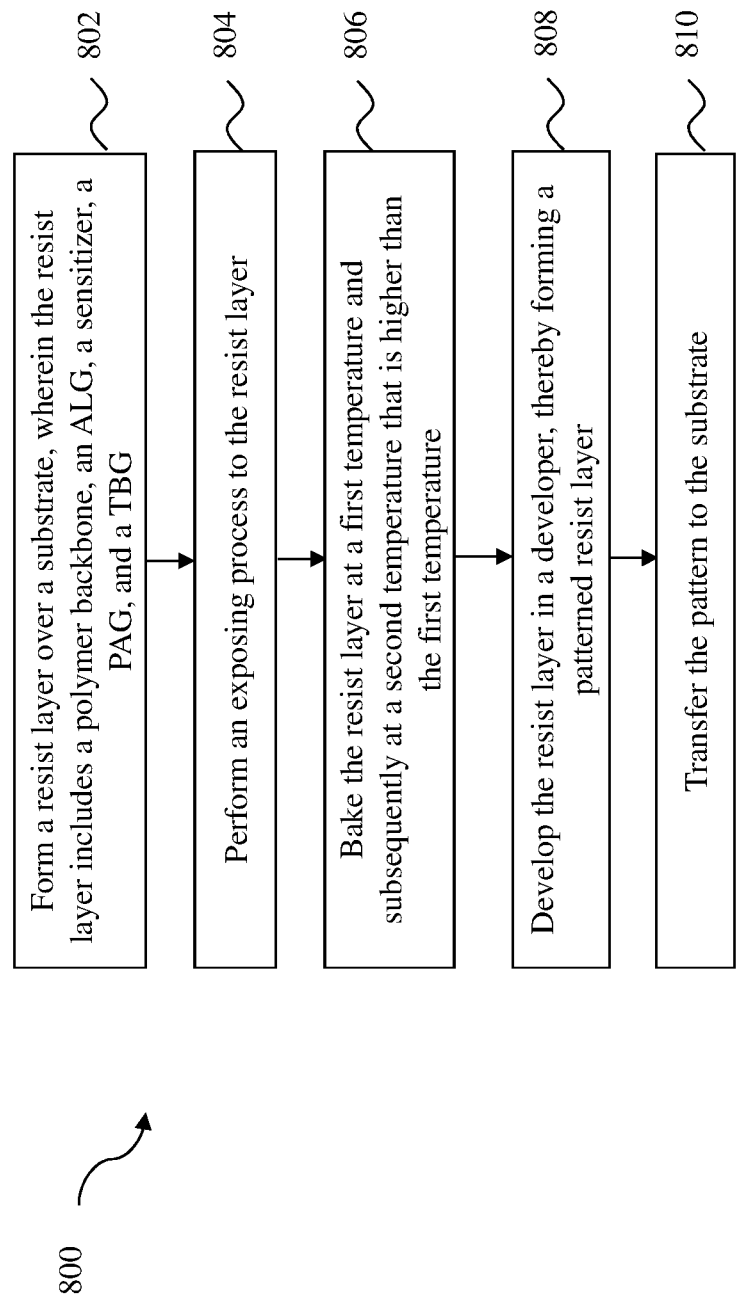
FIG. 8 is a flowchart showing an illustrative method of using a photoresist material of FIG. 3 that contains a thermo-base generator (TBG), in accordance with some embodiments.

FIG. 8 is a flowchart showing an illustrative method 800 of using a resist material containing a TBG that reduces resist film loss and improves resist contrast, in accordance with some embodiments of the present disclosure. The method 800 may be implemented, in whole or in part, by a system employing deep ultraviolet (DUV) lithography, extreme ultraviolet (EUV) lithography, electron beam (e-beam) lithography, x-ray lithography, and other lithography processes to improve pattern dimension accuracy. In the present embodiment, EUV lithography is used as the primary example. As illustrated, the method 800 includes a plurality of enumerated process steps which may be used to pattern a substrate as seen in FIGS. 1A-D, in conjunction with the description above accompanying FIGS. 2-7. Embodiments of the method 800 may include additional processes, steps, or operations before, after, in between, or as part of any of the enumerated steps.

According to one embodiment, the method 800 includes an operation 802 for forming a resist layer over a substrate, wherein the resist layer includes a polymer backbone, an ALG, a sensitizer, a PAG, and a TBG. For example, the resist material may have a composition like the ones illustrated in FIGS. 3-7. The method 800 further includes an operation 804 for performing an exposing process to the resist layer. The exposing process may be performed by the apparatus illustrated in FIG. 2. The method 800 proceeds to an operation 806 by baking the resist layer at a first temperature and subsequently at a second temperature. The second temperature is higher than the first temperature. The TBG decomposes and releases a base under the second temperature, which is higher than the first temperature. The base further reacts with the cleaved ALG in the resist material, which increase the insolubility of the resist layer in a negative tone developer. The operation 806 may be as described above in the text accompanying FIGS. 1C and 3. The method 800 further includes an operation 808 for developing the resist layer, thereby forming a patterned resist layer. The developing process may be as described above in the text accompanying FIG. 1C. The method 800 then proceeds to operation 810 to transfer the pattern to the substrate. The transferring of the pattern may be an etching process as described above in the text accompanying FIG. 1D.

Figure 9:
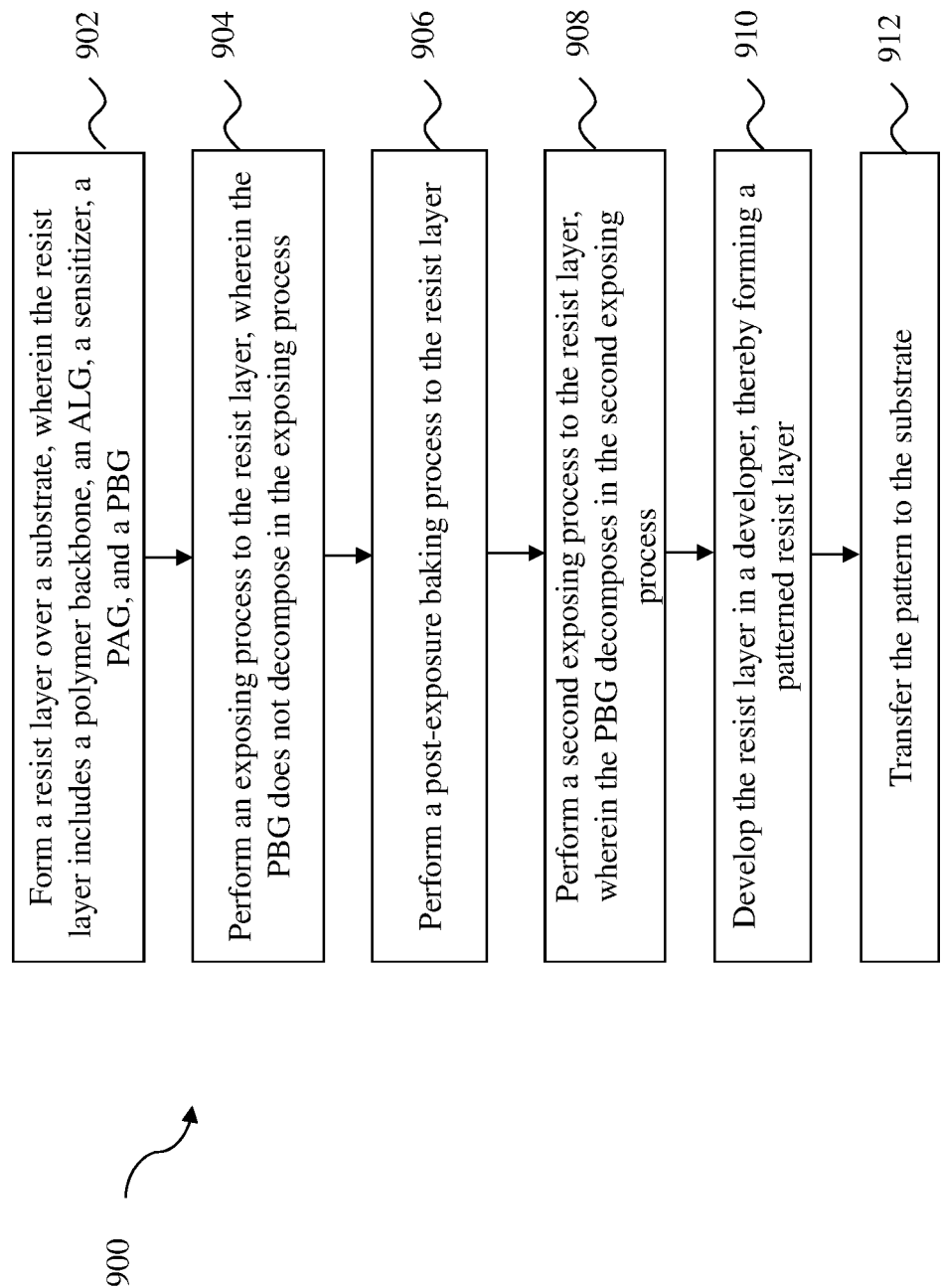
FIG. 9 is a flowchart showing an illustrative method of using a photoresist material of FIG. 3 that contains a photobase generator (PBG), in accordance with some embodiments.

FIG. 9 is a flowchart showing an illustrative method 900 of using a resist material containing a PBG that reduces resist film loss and improves resist contrast, in accordance with some embodiments of the present disclosure. The method 900 may be implemented, in whole or in part, by a system employing deep ultraviolet (DUV) lithography, extreme ultraviolet (EUV) lithography, electron beam (e-beam) lithography, x-ray lithography, and other lithography processes to improve pattern dimension accuracy. In the present embodiment, EUV lithography is used as the primary example. As illustrated, the method 900 includes a plurality of enumerated process steps which may be used to pattern a substrate as seen in FIGS. 1A-D, in conjunction with the description above accompanying FIGS. 2-7. Embodiments of the method 900 may include additional processes, steps, or operations before, after, in between, or as part of any of the enumerated steps.

According to one embodiment, the method 900 includes an operation 902 for forming a resist layer over a substrate, wherein the resist layer includes a polymer backbone, an ALG, a sensitizer, a PAG, and a PBG. For example, the resist material may have a composition like the ones illustrated in FIGS. 3-7. The method 900 further includes an operation 904 for performing an exposing process to the resist layer. The PBG is insensitive to the radiation used in this exposing process and does not decompose. The exposing process may be performed by the apparatus illustrated in FIG. 2. The method 900 proceeds to an operation 906 by performing a post-exposure baking (PEB) process to the resist layer. The ALG is cleaved by the acid released from the PAG. The method 900 proceeds to an operation 908 by performing a second exposing process to the resist layer. The second exposing process may be a blanket exposing to the whole resist layer without using a mask or alternatively an exposing to the same exposed portions in the previous exposing process with a mask. The PBG decomposes and releases a base corresponding to this radiation of the second exposing process. The base reacts with the cleaved ALG in the resist material, which increase the insolubility of the cleaved ALG in a negative tone developer. The operations 906 and 908 may be as described above in the text accompanying FIGS. 1C and 3. The method 900 further includes an operation 910 for developing the resist layer, thereby forming a patterned resist layer. The developing process may be as described above in the text accompanying FIG. 1C. The method 900 then proceeds to operation 912 to transfer the pattern to the substrate. The transferring of the pattern may be an etching process as described above in the text accompanying FIG. 1D.

Although not shown in FIG. 1, both methods 800 and 900 may proceed to forming a final pattern or an IC device on the substrate 102. In an embodiment, the substrate 102 is a semiconductor substrate and the method 800 (900) proceed to forming fin field effect transistor (FinFET) structures. In this embodiment, operation 810 (912) forms a plurality of active fins in the semiconductor substrate 102. The active fins have uniform CD, due to the low LER and LWR of the resist pattern 106a. In another embodiment, the method 800 (900) proceeds to forming a plurality of gate electrodes in the semiconductor substrate 102. The gate electrodes have uniform gate length due to the resist pattern 106a' s smooth sidewalls. The method 800 (900) may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 102, which has been etched by operation 810 (912) to include a plurality of trenches. The method 800 (900) proceeds to filling the trenches with a conductive material, such as a metal; and polishing the conductive material using a process such as chemical mechanical planarization (CMP) to expose the patterned ILD layer, thereby forming the metal lines in the ILD layer. The above are non-limiting examples of devices/structures that can be made and/or improved using the method 800 (900) and the resist material 300 according to various aspects of the present disclosure.

Although not intended to be limiting, one or more embodiments of the present disclosure provide many benefits to a semiconductor device and the formation thereof, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. The resist material constructed according to the present disclosure provides superior performance in NTD processes for advanced lithography, such as EUV lithography or e-beam lithography. Specifically, the resist material includes a polymer backbone, an acid labile group (ALG) bonded to the polymer backbone, a sensitizer bonded to the polymer backbone, a photo-acid generator (PAG), and a base generator (a TBG or a PBG). Using such resist material leads to reduced resist film loss, enhanced resist contrast, reduced resist pattern swelling, and reduced resist pattern surface roughness such as line edge roughness (LER) and/or line width roughness (LWR). Such resist material is advantageous in nanometer semiconductor fabrication where critical dimension (CD) uniformity has become a critical factor in circuit performance.

In one exemplary aspect, the present disclosure is directed to a method. The method includes forming a resist layer over a substrate, wherein the resist layer includes a polymer backbone, an acid labile group (ALG) bonded to the polymer backbone, a sensitizer bonded to the polymer backbone, a photo-acid generator (PAG), and a thermo-base generator (TBG); performing an exposing process to the resist layer; baking the resist layer at a first temperature and subsequently at a second temperature, wherein the second temperature is higher than the first temperature; and developing the resist layer in a developer, thereby forming a patterned resist layer.

In another exemplary aspect, the present disclosure is directed to a method for lithography patterning. The method includes forming a photoresist layer over a substrate, wherein the photoresist layer includes a polymer backbone, an acid labile group (ALG) bonded to the polymer backbone, and a thermo-base generator (TBG); exposing a portion of the photoresist layer to a radiation, resulting in a cleaved ALG; performing a baking process after the exposing of the portion of the photoresist layer, wherein the TBG releases a base during the performing of the PEB and the cleaved ALG has a chemical reaction with the base, and wherein a polarity of the photoresist layer is adjusted after the chemical reaction with the base; and removing an unexposed portion of the photoresist layer in a developer, resulting in a patterned photoresist layer.

In another exemplary aspect, the present disclosure is directed to a method for lithography patterning. The method includes forming a photoresist layer over a substrate, wherein the photoresist layer includes a polymer backbone, an acid labile group (ALG) bonded to the polymer backbone, a sensitizer bonded to the polymer backbone, a photo-acid generator (PAG), and a thermo-base generator (TBG); performing an exposing process to the photoresist layer; baking the photoresist layer at a first temperature lower than a triggering temperature for the TBG to release a base; baking the photoresist layer at a second temperature higher than the triggering temperature; and after the baking of the photoresist layer at the second temperature, developing the photoresist layer in a negative tone developer, thereby forming a patterned photoresist layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a resist layer over a substrate, wherein the resist layer includes a polymer backbone, an acid labile group (ALG) bonded to the polymer backbone, a sensitizer bonded to the polymer backbone, a photo-acid generator (PAG), and a thermo-base generator (TBG);
   performing an exposing process to the resist layer;
   baking the resist layer at a first temperature and subsequently at a second temperature, wherein the second temperature is higher than the first temperature; and
   developing the resist layer in a developer, thereby forming a patterned resist layer.

2. The method of claim 1, wherein:
   the first temperature is lower than a triggering temperature for the TBG to release a base; and
   the second temperature is higher than the triggering temperature.

3. The method of claim 2, wherein the baking of the resist layer is after the performing of the exposing process and prior to the developing of the resist layer.

4. The method of claim 2, wherein:
   the first temperature is within a range of 90 degree Celsius to 130 degree Celsius; and
   the second temperature is within a range of 140 degree Celsius to 250 degree Celsius.

5. The method of claim 1, wherein the TB G includes a chemical structure selected from the group consisting of an amide, a sulfonamide, an imide, an imine, an O-acyl oxime, and a benzoyloxycarbonyl derivative.

6. The method of claim 1, wherein the performing of the exposing process includes applying an extreme ultraviolet (EUV) radiation to the resist layer.

7. The method of claim 1, wherein the sensitizer is able to generate an electron in response to the exposing process.

8. The method of claim 7, wherein:
   the sensitizer includes a phenol group; and
   the polymer backbone includes one of an acrylate-based polymer, a poly(norbornene)-co-malaic anhydride (COMA) polymer, and a polyhydroxystyrene (PHS) polymer.

9. The method of claim 1, wherein the developer contains an organic solvent, the organic solvent including an ester group or a ketone group.

10. The method of claim 9, wherein the developer includes a compound selected from the group consisting of 2-heptanone, n-butyl acetate, isoamyl acetate, cyclohexanone, 2-heptanone, 5-methyl-2-hexanone, methyl-2-hydroxyisobutyrate, ethyl lactate, monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, and isobutyl propionate.

11. A method for lithography patterning, comprising:
   forming a photoresist layer over a substrate, wherein the photoresist layer includes a polymer backbone, an acid labile group (ALG) bonded to the polymer backbone, and a thermo-base generator (TBG);
   exposing a portion of the photoresist layer to a radiation, resulting in a cleaved ALG;
   performing a baking process after the exposing of the portion of the photoresist layer, wherein the TBG releases a base during the performing of the baking process and the cleaved ALG has a chemical reaction with the base, and wherein a polarity of the photoresist layer is adjusted after the chemical reaction with the base; and
   removing an unexposed portion of the photoresist layer in a developer, resulting in a patterned photoresist layer.

12. The method of claim 11, wherein the performing of the baking process includes:
   baking the photoresist layer at a first temperature, wherein the first temperature does not trigger the TBG to release the base; and
   baking the photoresist layer at a second temperature that is higher than the first temperature, wherein the second temperature triggers the TBG to release the base.

13. The method of claim 11, wherein the cleaved ALG includes a carboxyl group.

14. The method of claim 13, wherein the carboxyl group is a COOH bonded to the polymer backbone, and wherein a solubility of the photoresist layer in the developer is reduced after the chemical reaction with the base.

15. The method of claim 11, wherein the radiation is an extreme ultraviolet (EUV) radiation.

16. The method of claim 15, wherein the photoresist layer further includes a sensitizer bonded to the polymer backbone, and wherein the sensitizer is able to generate an electron in response to the EUV radiation.

17. The method of claim 11, wherein the photoresist layer further includes a lactone bonded to the polymer backbone.

18. A method for lithography patterning, comprising:
forming a photoresist layer over a substrate, wherein the photoresist layer includes a polymer backbone, an acid labile group (ALG) bonded to the polymer backbone, a sensitizer bonded to the polymer backbone, a photo-acid generator (PAG), and a thermo-base generator (TBG);
performing an exposing process to the photoresist layer;
baking the photoresist layer at a first temperature lower than a triggering temperature which is for the TBG to release a base;
baking the photoresist layer at a second temperature higher than the triggering temperature; and
after the baking of the photoresist layer at the second temperature, developing the photoresist layer in a negative tone developer, thereby forming a patterned photoresist layer.

19. The method of claim 18, wherein:
the first temperature is within a range of 90 degree Celsius to 130 degree Celsius; and
the second temperature is within a range of 140 degree Celsius to 250 degree Celsius.

20. The method of claim 18, wherein the TBG includes a chemical structure selected from the group consisting of an amide, a sulfonamide, an imide, an imine, an O-acyl oxime, and a benzoyloxycarbonyl derivative.

* * * * *